United States Patent [19]

Matsunaga

[11] Patent Number: 5,416,345
[45] Date of Patent: May 16, 1995

[54] SOLID-STATE IMAGE SENSOR WITH DARK-CURRENT ELIMINATOR

[75] Inventor: Yoshiyuki Matsunaga, Kamakura, Japan

[73] Assignee: Kabushiki Kaisha Toshiba, Kawasaki, Japan

[21] Appl. No.: 329,426

[22] Filed: Oct. 24, 1994

Related U.S. Application Data

[63] Continuation of Ser. No. 227,175, Apr. 13, 1994, abandoned, which is a continuation of Ser. No. 858,485, Mar. 27, 1992, abandoned.

[30] Foreign Application Priority Data

Mar. 28, 1991 [JP] Japan ................................ 3-065105
Jan. 23, 1992 [JP] Japan ................................ 4-010054

[51] Int. Cl.$^6$ ................. H01L 29/78; H01L 27/14; H01L 31/00
[52] U.S. Cl. ................................ 257/223; 257/230; 257/232
[58] Field of Search .............. 257/230, 231, 232, 233, 257/225, 229

[56] References Cited

U.S. PATENT DOCUMENTS

| | | | |
|---|---|---|---|
| 4,498,013 | 2/1985 | Kuroda et al. | 257/230 |
| 4,851,890 | 7/1989 | Miyatake | 257/232 |
| 4,912,560 | 3/1990 | Osawa et al. | 257/232 |

FOREIGN PATENT DOCUMENTS

| | | | |
|---|---|---|---|
| 59-196667 | 11/1984 | Japan | 257/230 |
| 62-221147 | 9/1987 | Japan | 257/232 |
| 3-196569 | 8/1991 | Japan | 257/229 |
| 2240429 | 7/1991 | United Kingdom | 257/225 |

OTHER PUBLICATIONS

IEEE International Solid-State Circuits Conference, Wednesday, Feb. 15, 1989, "Imager and sensors", pp. 96 and 97.
IEEE, 1986, "A new mos image sensor operating in a non-destructive readout mode", T. Nakamuara, et al., Semiconductor Technology Center, Japan; pp. 353-356.

*Primary Examiner*—Ngân V. Ngô
*Attorney, Agent, or Firm*—Oblon, Spivak, McClelland, Maier & Neustadt

[57] ABSTRACT

A solid-state image sensing device includes a semiconductive substrate, an array of photosensitive cells on the substrate, and a transfer section electrically coupled with the array on the substrate, for transferring electrical carriers read from the cells along a predetermined direction. During an image sensing operation, a packet of charge carriers photoelectrically generated in the cells are prevented from continuously staying therein, by forcing the carriers to move into the transfer section, thus causing these carriers to be stored in the transfer section.

12 Claims, 9 Drawing Sheets

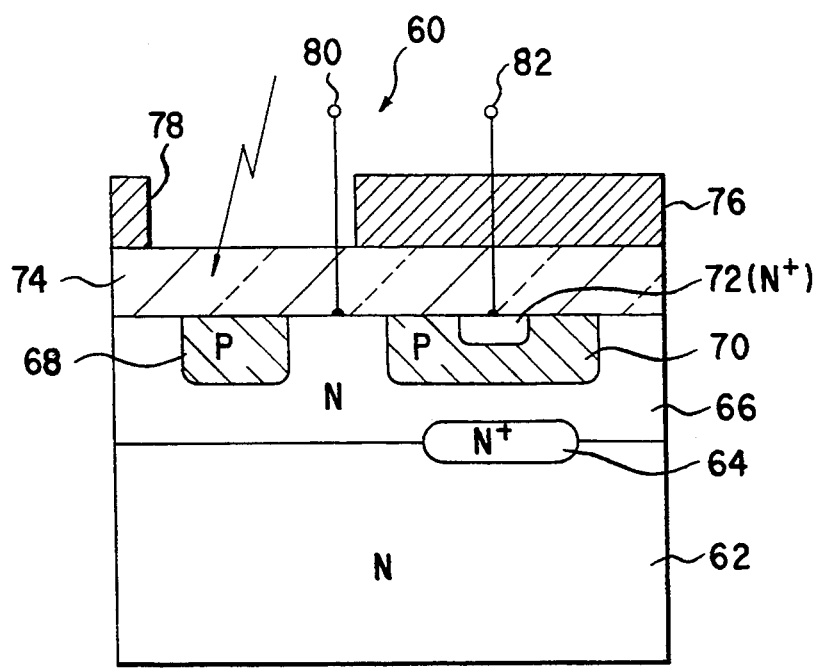
F I G. 5
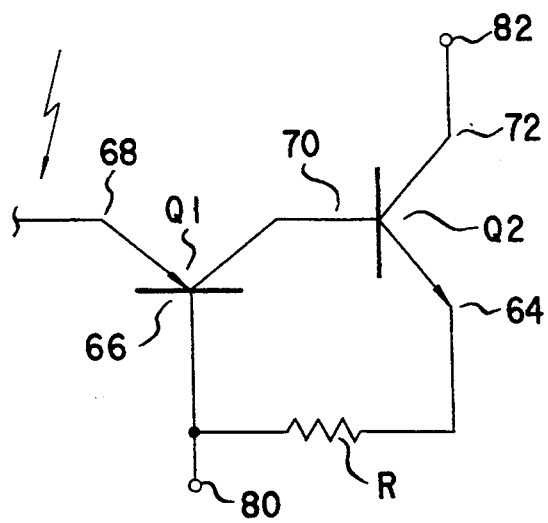
F I G. 6

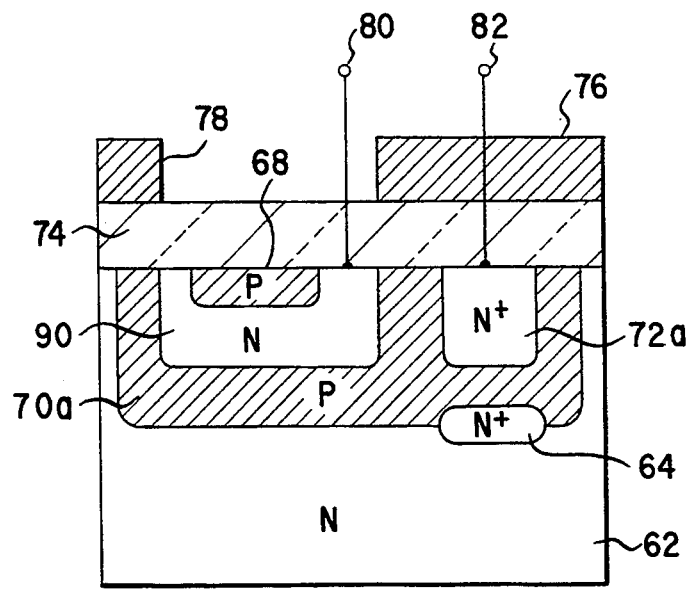
F I G. 7
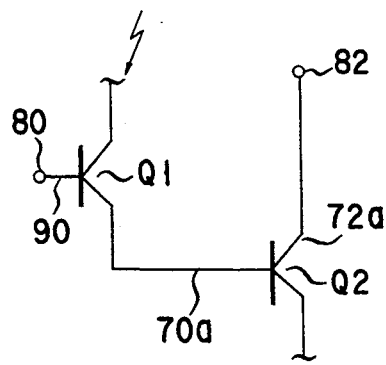
F I G. 8
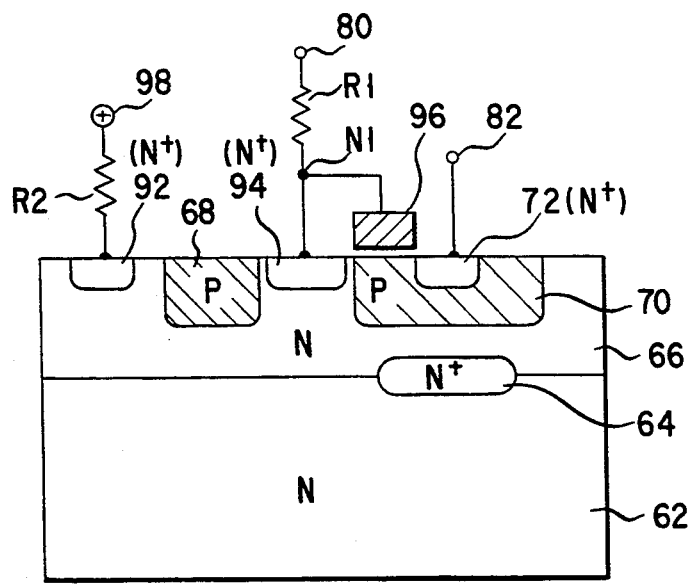
F I G. 9

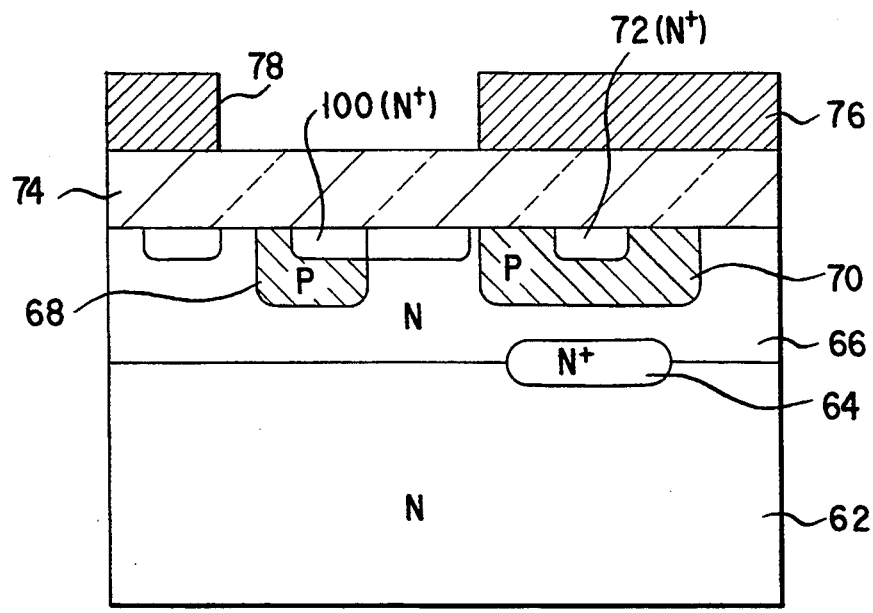
FIG. 10
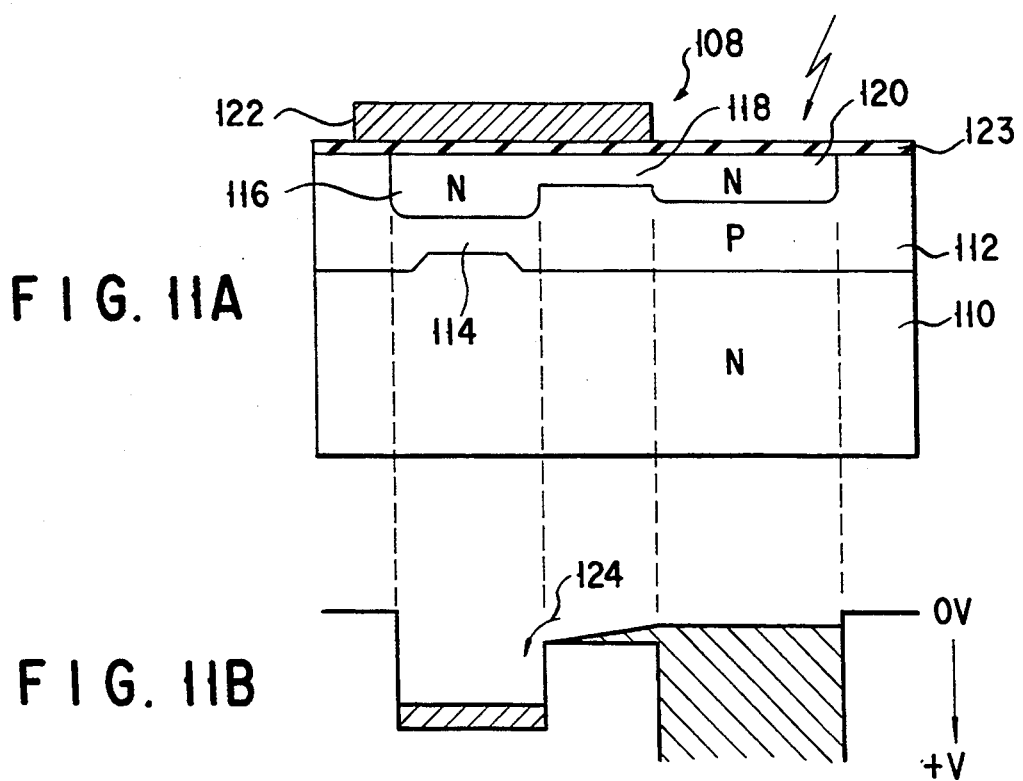
FIG. 11A
FIG. 11B

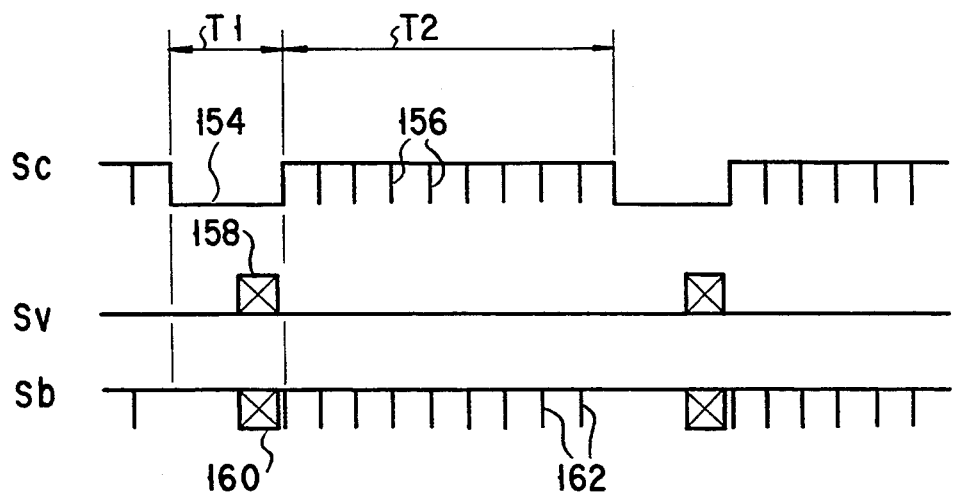
F I G. 15
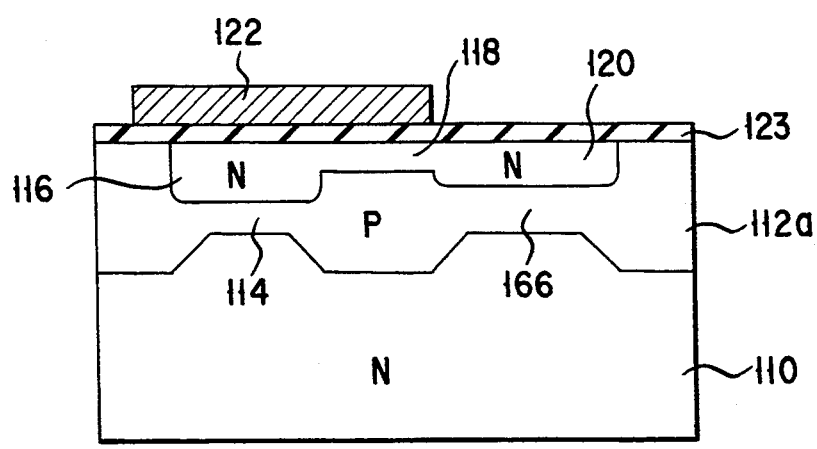
F I G. 16

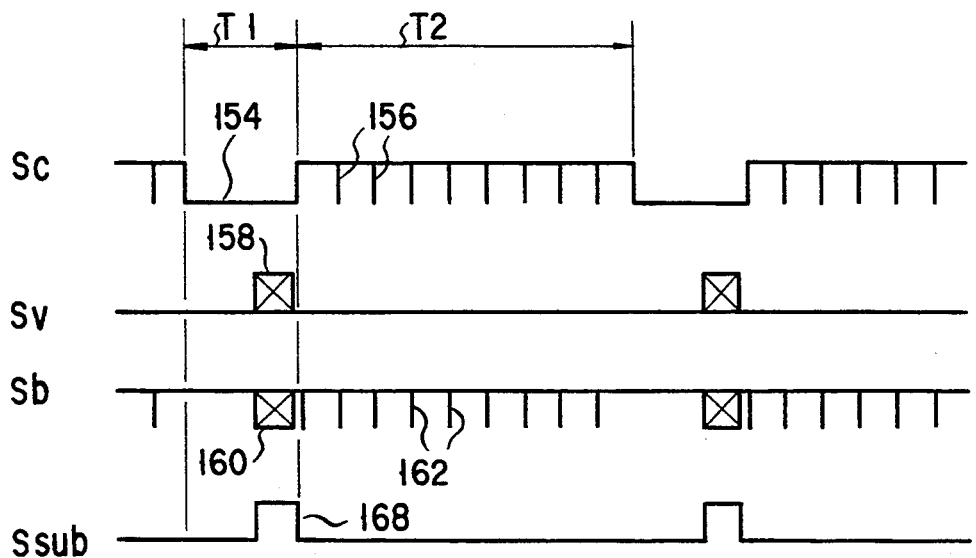
F I G. 17
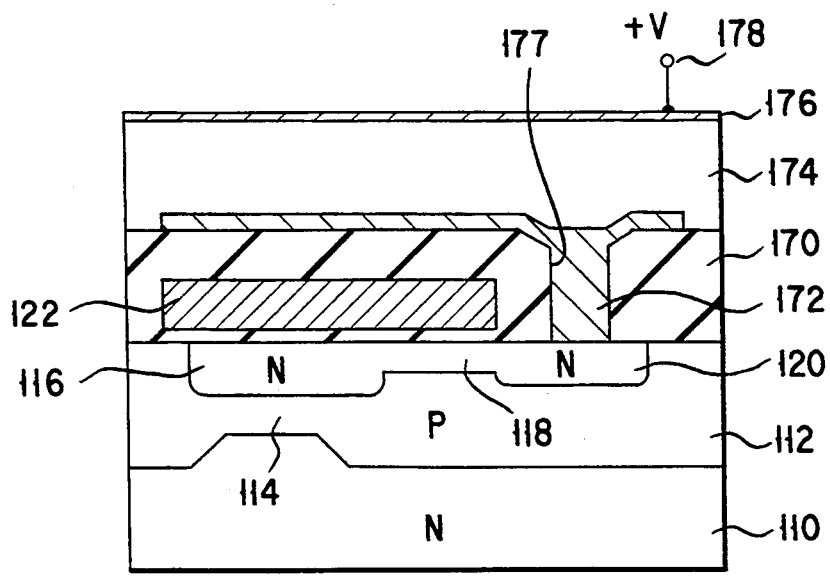
F I G. 18

SOLID-STATE IMAGE SENSOR WITH DARK-CURRENT ELIMINATOR

This application is a continuation of application Ser. No. 08/227,175, filed on Apr. 13, 1994, now abandoned, which was a continuation of application Ser. No. 07/858,485, filed on Mar. 27, 1992, now abandoned.

BACKGROUND OF THE INVENTION

1. Field of the Invention

The present invention relates generally to solid-state imaging devices, and more particularly to a charge transfer device for use in an image sensing system including a video movie camera and an electronic still camera or the like.

2. Description of the Related Art

Recently, in place of the conventional vacuum pickup tubes, solid-state charge coupled device (CCD) image sensors have been increasingly used in video movie cameras or electronic still-image cameras as their imaging elements. Employment of such CCD image sensors provides several technical advantages such as down-sizing, higher operating reliability, and so forth.

The current developmental thrust of CCD image sensor technology is toward dramatic image-quality improvement. As the electronic cameras require higher image quality, the CCD image sensors become more critical in the photosensitivity. Unfortunately, presently available image sensors cannot catch up with such trend of high-sensitivity achievement. The main reason thereof is that the image sensors cannot eliminate successfully the generation of a leak current called "dark current" in the photosensitive charge packet storage cells. During an image pickup period, unless such dark current is eliminated successfully, the resultant effective signal charge packets decrease in amount to deteriorate the photosensitivity. If the dark current characteristic varies among the cells of an image sensor due to inherent deviation in the manufacturing process thereof, such variation will cause the signal charge packets to contain noise. The noise occurrence will lead to further deterioration of the sensitivity characteristic of the image sensor.

A solid-state amplifying imager using a bipolar transistor is disclosed, for example, in "A 310k Pixel Bipolar Imager," Nobuyoshi Tanaka et al., International Solid-State Circuits Conference (ISSCC) Digest of Technical Papers, 1989, at pp. 96–97 (FIG. 1). The bipolar image sensor has a semiconductive substrate of N type conductivity, which defines a plurality of cell-formation areas on its top surface. A semiconductor layer of P type conductivity is formed in each cell area on the substrate surface. The P type layer functions as a base region of the bipolar transistor, while the substrate serves as a collector of it. A heavily-doped N (N+) type layer is arranged within the P type base layer to serve as an emitter region of the transistor. When an incident light coming from a scene being photographed is introduced onto the bipolar cell structure, charge carriers (holes) are photoelectrically produced and stored (integrated) in the P type base layer. By applying a positive voltage to a gate electrode insulatively disposed above the P type base layer, the charge carriers are read from the N+ emitter layer to create a corresponding cell current amplified by the bipolar transistor.

With the bipolar imager, the P type base layer and the N type substrate are set in a reverse bias condition during both a charge-integration period and a read period. In particular, during the integration period, a certain reverse bias voltage is applied therebetween, which voltage is greater in potential than that used during the read period. Note here that the term "reverse bias" is defined as a specific biasing state with the positive voltage being applied to the N type substrate. If a positive voltage is applied to the substrate, the base and the substrate (collector) will be forward-biased, thus causing a current to flow in the bipolar transistor. This results in that the current is amplified by a known transistor action. When the positive voltage is at 0.6 volts, the transistor current is almost saturated. The forward-current saturation region of the voltage-to-current characteristic diagram has been conventionally employed as a signal charge packet reading region. In this case, the saturation current occurring in the cell structure acts as the leak current or dark current Id. From the above explanation, it may be understood that it is inherently very difficult to eliminate the dark current Id from the bipolar imager, although such has been long desired among those skilled in the image sensor art. If the dark current potentially varies among a number of cells, the elimination of noise will become more difficult, which is a serious bar to the achievement of the high-sensitivity imager.

It may be considered that the generation of leak current can be suppressed by causing the reverse bias voltage to be less than 0.6 volts, and that the leak current can be eliminated almost completely under a zero-bias condition. However, such a narrow-ranged idea is not employed by a skilled person in the image sensor art. The reason is simple: Any bipolar imager can no longer operate normally under such an abnormal biasing condition. If the "lesser" bias condition is employed, the N type substrate serving as the transistor collector region must be kept at a lower potential while charge carriers are being read from the P type base layer by applying a drive voltage to the gate electrode. As far as the collector potential remains lower, the carriers that should flow toward the N+ emitter layer run away uncontrollably toward the collector layer. The effective signal charge packets are thus reduced in amount accordingly. If a zero-bias condition is employed, no signal charge carriers can be obtained.

For the above reasons, it has been recommended that the bipolar imagers are driven by providing their photosensitive cells with a reverse bias voltage of 2 volts or more. As far as such drive system is used, the bipolar imagers are compelled to suffer from the payment of vicarious compensation for increase in the dark current and decrease in the photosensitivity.

SUMMARY OF THE INVENTION

It is therefore an object of the present invention to provide a new and improved solid-state imaging device that is excellent in the photosensitivity.

In accordance with the above object, the present invention is drawn to a solid-state image sensor, which comprises a specific photosensitive cell structure including a semiconductive substrate, and a bipolar type phototransistor arranged in the substrate. The phototransistor includes a semiconductor layer of a conductivity type opposite to that of the substrate as a base region of the phototransistor.

BRIEF DESCRIPTION OF THE DRAWINGS

FIGS. 5 and 7 are diagrams showing in cross-section photosensitive cell sections according to other embodiments of the invention, and FIGS. 6 and 8 are diagrams showing the equivalent circuits of the cell structures of the preceding figures.

FIGS. 9 and 10 are diagrams showing in cross-section photosensitive cell structures in accordance with further embodiments of the invention.

FIG. 11A is a diagram showing the sectional view of a photosensitive cell structure in accordance with a further embodiment of the invention, and FIG. 11B is a diagram showing the potential well distribution of the cell structure of FIG. 11A.

FIG. 15 is an illustration of timing diagram showing the pulsing sequence of the embodiment of FIG. 14.

FIGS. 16, 18 and 19 are diagrams showing still further embodiments of the present invention, and FIG. 17 is an illustration of timing diagram showing the pulsing sequence of the embodiment of FIG. 16.

DETAILED DESCRIPTION OF THE PREFERRED EMBODIMENTS

Figure 1:
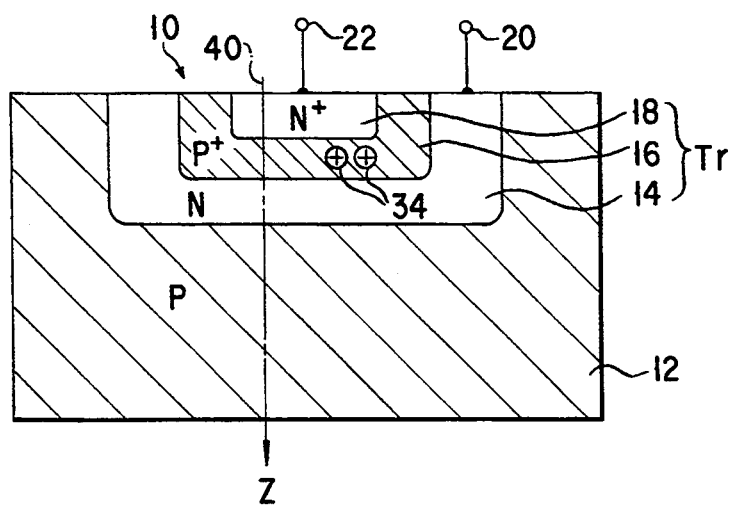
FIG. 1 is a diagram showing the cross-sectional structure of one of photosensitive cells of a solid-state imager in accordance with one preferred embodiment of the invention.

Referring now to FIG. 1, a charge coupled device (CCD) area image sensor of bipolar transistor type in accordance with one preferred embodiment of the invention is generally designated by the numeral 10. The bipolar image sensor 10 has a semiconductive substrate 12 of P type conductivity. This substrate may be made from silicon. Bipolar image sensor 10 includes an N type semiconductor layer 14 arranged in each of a plurality of photosensitive charge packet storage cell sections. N type collector layer 14 is arranged in P type substrate 12 to serve as a photoconversion carrier-storage section, in which a number of photoelectrically produced charge carriers are integrated. A heavily-doped P (P+) type semiconductor layer 16 is formed within N type layer 14. A heavily-doped N (N+) type semiconductor layer 18 is arranged in P+ layer 16. A terminal 20 is provided and connected to N type layer 14. Another terminal 22 is coupled to N+ type layer 18.

The layers 14, 16, 18 of FIG. 1 constitute a bipolar type phototransistor Tr, which uses the N type layer 14 as its collector region, P+ layer 16 as a base region, and N+ layer 18 as an emitter region. Terminal 20 functions as a collector electrode terminal of bipolar transistor Tr. Terminal 22 acts as an emitter electrode terminal of transistor Tr.

Figure 2:
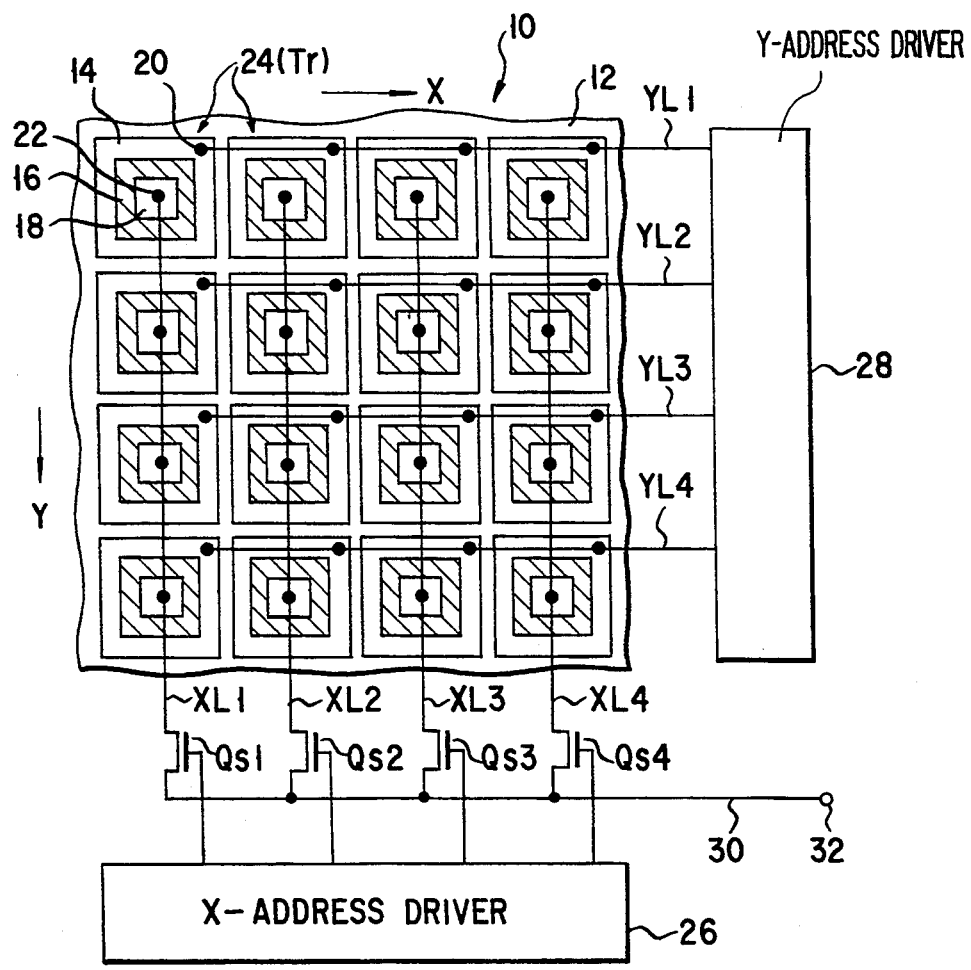
FIG. 2 is a diagram showing the circuitry for driving the imager shown in FIG. 1.

The main part of bipolar image sensor 10 of FIG. 1 is illustrated in FIG. 2, together with an electrical circuitry associated therewith. Image sensor 10 includes an array of rows and columns of photosensitive cells 24 arranged in a matrix fashion on substrate 12. The rows of cells 24 define the X-direction of image sensor 10, whereas the columns of cells define the Y-direction thereof. For purposes of illustration, only a four-by-four matrix portion is shown in FIG. 2. Each cell transistor 24 (Tr) has the layers 14, 16, 18 described above. Each terminal 20, 22 is drawn like a "bullet" symbol in the illustration of FIG. 2.

As shown in FIG. 2, a first address drive circuit 26 is electrically associated with the columns of cells 24. This address driver 26 may identify or select one from a number of X-addresses (column addresses) in the cell matrix. A second address drive circuit 28 is associated with the rows of cells. Address driver 28 may select one from among Y-addresses (row addresses) in the cell matrix. Drivers 26, 28 will be called "X- and Y-address drivers" respectively in the rest of the description.

More specifically, the X-address driver 26 is connected by first parallel address lines XL1, XL2, XL3, XL4, ... to terminals 22 of columns of cells 24. In other words, P+ emitter layers 18 of each cell column are coupled through terminals 22 to a corresponding one of X-address lines XL. A plurality of switch devices Qs1, Qs2, Qs3, Qs4 are arranged between X-address driver 26 and address lines XL1-XL4. These switch devices may be metal oxide semiconductor field effect transistors (MOSFETs), which may be replaced with a corresponding number of bipolar transistors, if required. MOSFETs Qs have gate electrodes, which are coupled to X-address driver 26. MOSFETs Qs are connected to address lines XL respectively at the first current-carrying electrodes thereof, and are connected to a common signal transmission wiring line 30 at the second current-carrying electrodes of MOSFETs Qs. Wiring line 30 serves as a signal read-out line, which is connected to an output terminal 32. MOSFETs Qs are controlled by X-address driver 26 such that each MOSFET Qsi (i=1, 2, 3 ... ) turns on, when it is selected in responding to an address designation by X-address driver 26, thereby causing signal charge carriers (read current) fed thereinto via a corresponding address line XLi i=1, 2, 3 ... ) to be transmitted onto signal read line 30. On the other hand, Y-address driver 28 is connected through second parallel address lines YL1, YL2, YL3, YL4, ... to terminals 20 of the rows of cells 24. In other words, N type collector layers 14 of each cell row are directly coupled at terminals 20 to a corresponding one of Y-address lines YL.

The imaging operation of the bipolar image sensor 10 is as follows. Principally, the imaging operation includes a charge-carrier storage (integration) mode and a signal charge read mode. Note that the following explanation is directed to a certain one of the cells 24 shown in FIG. 1. The same goes with the remaining cells.

In the storage mode, a specific reverse bias voltage is applied between the P+ base layer 16 and N type collector layer 14 of FIG. 1. This reverse bias voltage is so selected as to be 0.6 volts or less. N type collector layer 14 is held at a positive polarity potential. When an incident optical image is introduced onto image sensor 10, charge carriers (holes) are produced by photoelectric conversion within cell 24 of FIG. 1, and are then stored or integrated in the base region of bipolar transistor, i.e., the P+ layer 16, in a similar manner to that in the prior art. The holes stored are designated by the numeral 34 in FIG. 1.

Thereafter, the image sensor 10 is set in a subsequent signal-carrier read mode. Assume that a certain row of cells 24 connected with Y-address line YL1 is specified in the cell matrix configuration of FIG. 2, and that the carriers stored therein are to be read out. In this case, Y-address driver 28 of FIG. 2 applies a high-level voltage to the selected address line YL1; driver 28 applies a low-level potential to the remaining non-selected address lines YL2, YL3, YL4, . . . To read charge carriers sequentially out of the selected row of cells under such a condition, X-address driver 26 applies a high-level potential to the gate electrodes of MOS transistors Qs1, Qs2, Qs3, Qs4, . . . in this order. While the high-level potential is being applied to a certain MOS transistor Qsi, the gate electrodes of the other MOS transistors Qs1, Qs2, . . . Qs(i−1), Qs(i+1), . . . are held at the low-level potential.

With such a cell drive scheme, the selected cells coupled to the Y-address line YL1 are sequentially subjected to a read operation in a specific order specified by X-address driver 26. The cell positioned at the upper-left corner of the illustration of cell matrix of FIG. 2 is activated first; the upper-right cell is activated last. More specifically, first of all, MOS transistor Qs1 is driven to turn on, while having the remaining MOS transistors Qs2, Qs3, . . . rendered nonconductive, thus causing a read current from a corresponding one (the leftmost cell) of the selected cells to be supplied to common read-out line 30. Then, MOS transistor Qs2 begins to turn on with the MOS transistor Qs1 being now forced to turn off. At this time, the carriers, which are stored in a new one of the selected cells that is associated with X-address line XL2, are read to read-out line 30 by way of MOS transistor Qs2. A similar sequential-read operation will continue with respect to each of the remaining ones of the selected cells. This permits the carriers read out of the selected cells to flow as a cell current (signal carriers) toward output terminal 32 of FIG. 2 in a specified order.

Subsequently, a row that is connected to Y-address line YL2 is selected by Y-address driver 28 from among the rows of the cell matrix 24 shown in FIG. 2. X-address driver 26 then repeats a similar sequential-read operation, by performing the sequential high-voltage application described above. A similar operation will be carried out with respect to each of the cell rows coupled to Y-address lines YL3, YL4, . . . until all the cells 24 complete the read operations.

Figure 3:
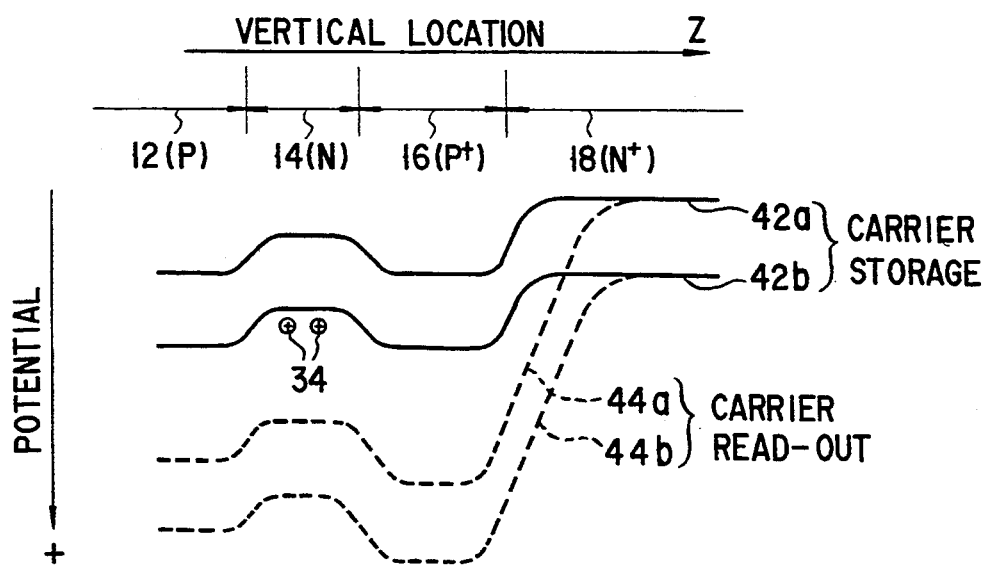
FIG. 3 is a graph showing changes in potential of several layers forming a bipolar cell structure shown in FIG. 1 during a carrier-storage period and a carrier read-out period of the imager.

The band potential characteristic of the cell structure 10 is illustrated in FIG. 3, which provides a graph showing several potential changes in the components 12, 14, 16, 18 of FIG. 1 along a specific direction Z that is vertical to the top surface of substrate 12 and is designated by a dash-and-dot line 40 shown in FIG. 1. The horizontal axis of this graph represents the positions of substrate 12 and layers 14, 16, 18 that are sequentially located from the top toward the bottom of substrate 12; the vertical axis of the graph represents the voltage potentials of these layers. Two characteristic curves 42a, 42b drawn in solid lines show the band potential changes during the charge storage period: Curve 42a represents the potential at the bottom of the conduction band; curve 42b indicates the potential at the valence band, wherein an intermediate space between these bands corresponds to the forbidden band. Two other characteristic curves 44a, 44b drawn as broken lines show the potential changes during the aforesaid sequential carrier read period. Curve 44a represents the conduction band potential, whereas curve 44b represents the valence band potential.

As is apparent from viewing FIG. 3, in the charge carrier storage mode, the reverse bias voltage is applied between P+ base layer 16 and N type collector layer 14, causing the photoelectrically converted holes 34 to be stored or integrated within P+ base layer 16. When image sensor 10 is set in the read mode, since N type collector layer 14 changes at the high-level potential, the conduction band potential and the valence band potential of layer 14 become deeper as shown by broken lines 44a, 44b. As a result, the gradient of the band potential between P+ base layer 16 and N+ emitter layer 18 becomes more significant. Electrons are thus forced to flow from N+ emitter layer 18 through P+ base layer 16, while holes 34 flow from P+ base layer 16 toward N+ emitter layer 18. The holes then appear at the read-out terminal 22. Thereafter, the holes finally arrive at output terminal 32 of FIG. 2 in the manner described previously. Under the carrier read-out condition, the holes in P+ base layer 16 are recombined with the electrons that are introduced thereinto, thereby to provide an initialized or "reset" state.

With the bipolar image sensor 10, unlike the prior art device described in the introductory part of the description, each cell 24 includes the N type collector layer 14 that acts as a photoconversion storage section and is electrically separated by PN-junction from the remaining cells of sensor 10. N type collector layer 14 differs in conductivity type from substrate 12 as shown in FIG. 1. This may permit sensor 10 to electrically drive only the N type collector layer 14 of a selected cell while a carrier read operation is being performed, regardless of the electrical conditions of the remaining cells. It is thus possible in the read mode to supply the selected N type collector layer 14 with a higher voltage than that in the storage mode. As a result, the efficiency of carrier read-out operation can be enhanced without necessitating the reverse-bias voltage between P+ base layer 16 and N type collector layer 14 to rise in potential. The efficiency enhancement can also be effected even if the reverse-bias voltage is potentially decreased. Such the "reverse-bias voltage decreasing" capability may suppress or prevent a dark current (Id) from taking place undesirably. This contributes to an improvement in the signal-to-noise ratio of the bipolar image sensor, thus enhancing the photosensitivity characteristic thereof.

Figure 4:
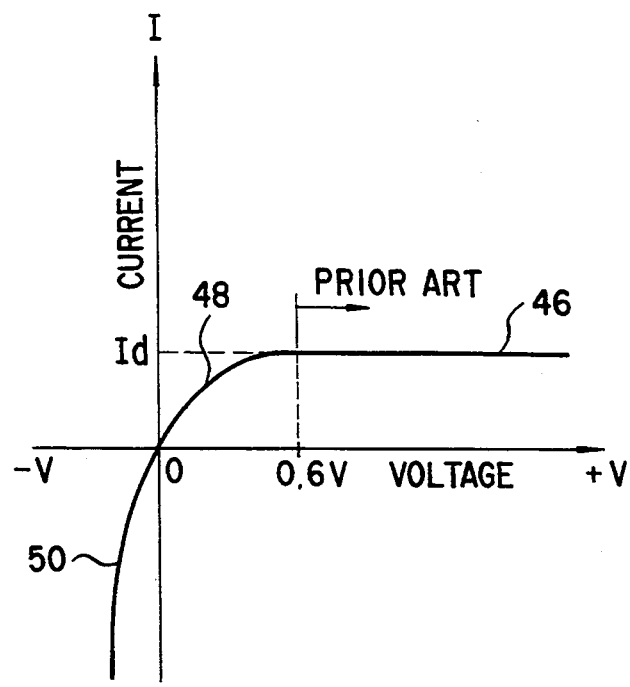
FIG. 4 is a graph showing the voltage-to-current characteristic of the embodiment with bipolar cell structure.

The conceptual difference between the embodiment sensor 10 and the prior art will become apparent by viewing the voltage-to-current characteristic of bipolar transistor shown in FIG. 4. In the graph of FIG. 4, the horizontal axis represents the reverse bias voltage to be given to the PN junction section of a photosensitive cell of bipolar image sensors, and the vertical axis represents the current flowing therein. The prior art device has employed a limited current saturation region of the reverse bias voltage being greater than 0.6 volts, as designated by a straight line 46. The dark current in this case is represented by "Id," which tends to vary among a number of cells on the same substrate, causing a noise to easily occur to decrease the resulting photosensitivity, as has been described previously. In contrast, with the image sensor 10 of the present invention having the specific "collector-separated" bipolar cell structure, an image sensing operation is performed in accordance with a different characteristic curve region 48 in the positive polarity area of the characteristic diagram, wherein the reverse-bias voltage is less than 0.6 volts. Therefore, the dark current Id can be remarkably reduced. If the reverse bias voltage is set at zero volts (no-bias condition at the point "0" in the graph of FIG. 4), the dark current flow will be substantially zero.

Furthermore, the embodiment sensor 10 enables the P+ base layer 16 and N type collector layer 14 to be set in the forward bias condition during the read operation of signal charge carriers, as shown by a curve 50 in FIG. 4. In this case, it becomes possible to prevent the amplitude of an output image signal from increasing beyond the allowable range when an incident light locally contains bright light components of high intensity. This may contribute to the accomplishment of an image sensor of wide-in-dynamic-range type.

Turning now to FIG. 5, a bipolar image sensor 60 in accordance with another embodiment of the invention is shown which includes an N type silicon substrate 62. An array of rows and columns of photosensitive cells are arranged on substrate 62 in a similar manner to that shown in FIG. 2. The characteristic feature of image sensor 60 is that each cell includes a couple of bipolar transistors Q1, Q2 that are arranged as shown in FIG. 6.

More specifically, as shown in FIG. 5, an N+ semiconductive layer 64 is formed on N type substrate 62 in each cell area of image sensor 60. An N type semiconductor layer 66 is formed on substrate 62 by a known epitaxial growth technique. This N type epitaxial layer 66 includes in its top surface region a first P type layer 68 and a second P type layer 70. An N+ layer 72 is formed in layer 70. The top surface of epitaxial layer 66 is entirely covered with a transparent dielectric layer 74, which may be made from silicon oxide. An optical shield layer 76 is arranged on layer 74 to have an opening 78, which serves as a cell opening into which an incident light may be permitted to enter into this cell structure. A voltage terminal 80 is connected to N type layer 66, and another voltage terminal 82 is coupled to N+ layer 72.

An equivalent circuit configuration of the semiconductor cell structure of FIG. 5 is shown in FIG. 6, wherein a PNP bipolar transistor Q1 and an NPN bipolar transistor Q2 are associated with terminals 80, 82. The PNP type bipolar transistor Q1 is arranged using the N type layer 66 of FIG. 5 as a base, P type layer 68 as an emitter, and P type layer 70 as a collector. The NPN type bipolar transistor Q2 is arranged using p type layer 70 as a base, N+ layer 64 as an emitter, and N+ layer 72 as a collector. The collector of PNP bipolar transistor Q1 is coupled to the base of NPN bipolar transistor Q2, since P type layer 70 acts as the both electrodes at a time. The base of transistor Q1 is connected to terminal 80, and also is connected by way of a resistor R to the emitter of transistor Q2. The collector of transistor Q2 is coupled to terminal 82. Terminal 80 is coupled to the Y-address driver 28 by a corresponding one of the Y-address lines YL3, YL4, ... shown in FIG. 2. Terminal 80 is connected to the X-address driver 26 by a corresponding one of X-address lines XL. Terminals 80 may correspond to terminal 20 shown in FIG. 1, whereas terminal 82 corresponds to that 22 of FIG. 1.

The carrier read operation of the image sensor 60 with the "twin-bipolar transistor" cell structure as shown in FIGS. 5 and 6 is as follows. When a read control pulse signal is supplied from Y-address driver 28 of FIG. 2 through terminal 80 to the N type base layer 66 of PNP bipolar transistor Q1, a signal current then flows from p type emitter layer 68 of PNP bipolar transistor Q1 toward the base of NPN bipolar transistor Q2. This signal current is amplified by transistor Q2. The amplified current from N+ emitter layer 64 of transistor Q2 toward N+ collector layer 72 of transistor Q2. As a result, an amplified cell current may be read out of terminal 82.

The cell structure of FIG. 5 may be modified as shown in FIG. 7, wherein the P type layer 70 of FIG. 5 is replaced with a P type layer 70a, which surrounds P type emitter layer 68 of PNP bipolar transistor Q1. Layer 70a has a "W"-shaped profile. An N type region 90 is defined in one of two "U"-shaped portions of the W-shaped layer 70a such that N type region 90 is in direct contact with P type layer 68, and is connected to terminal 80. An N+ layer 72a is defined in the other of the U-shaped portions of W-shaped layer 70a such that layer 72a is in contact with layer 70a and is coupled to terminal 82 as shown.

The cell structure of FIG. 7 provides PNP bipolar transistor Q1 and NPN bipolar transistor Q2 which are connected as shown in FIG. 8. Transistor Q1 has a collector connected to the base (70a) of transistor Q2. With such a cell structure, N type layer 90 serves as the base of transistor Q1, causing this base to be structurally separated from the emitter of transistor Q2. Such "base/emitter-separation" feature may allow transistors Q1, Q2 in each cell section to be set in different reverse-bias conditions independently of each other.

A bipolar cell structure shown in FIG. 9 is similar to that of FIG. 5 with two N+ layers 92, 94 being added in N type layer 66, and with an insulated gate electrode 66 being arranged above layer 96 to overlie one of the two top ends of "U"-shaped layer 70. Gate 96 is coupled at a node N1 to N+ layer 94. Node N1 is coupled through a resistor R1 to terminal 80. N+ type layers 92, 94 are located on the both sides of P type layer 68 in N type layer 66. N+ layer 92 is connected through another resistor R2 to a positive polarity terminal 98.

With such an arrangement, the insulated gate 96 functions as a coupling gate for coupling a corresponding Y-address line YLj (j=1, 2, 3, ...) with the base layer 70 of transistor Q1. A reverse bias voltage is applied between N type base layer 66 of transistor Q1 and P type collector layer 70 of transistor Q2 during addressing. N+ layer 92 acts as an element separation layer. N+ layer 94 forms an electrical contact between address line YLj and the base layer 66 of transistor Q1.

A bipolar cell structure shown in FIG. 10 is similar to that of FIG. 5 with an N+ semiconductor layer 100 being additionally arranged in N type layer 66. This layer 100 is smaller in depth than P type layer 68. Layer 100 partly overlaps P type layer 68 to provide a "reverse L"-shaped profile. Layer 100 has one end portion that is positioned near P type layer 70. N+ layer 100 may act as a shield layer for restricting or preventing unnecessary carriers from being generated at the silicon/silicon-oxide (Si/SiO$_2$) interface in the cell structure. This may contribute to further improvement in the sensitivity of the image sensor.

A CCD cell structure in accordance with a still another embodiment of the invention is shown in FIG. 11A, wherein the cell structure has an N type silicon substrate 110 with a P type well region 112 being arranged therein. The depth of well region 112 is not simply uniform; its depth is partially decreased to define a shallow well subregion 114. Three continuous N type layers 116, 118, 120 are formed by diffusion in the top surface of well region 112. The intermediate N type diffusion layer 118 is smaller in depth than the remaining N type diffusion layers 116, 120 that are in contact with intermediate layer 118 at the both ends of layer 118. Shallow N type well subregion 114 positionally corresponds to N type layer 116 so that subregion 114 is located below layer 116. N type diffusion layer 120 and P type well region 112 constitute a PN-junction photodiode. N type diffusion layer 120 serves as a photoelectric conversion cell section. N type diffusion layer 116 acts as a vertical CCD buried-channel section. Intermediate N type layer 118 is a coupling region for connecting the photoelectric conversion section 120 and the channel section 116 together. An insulated transfer electrode 122 is disposed above substrate 110, and insulatively overlies N type diffusion layers 116, 118. Transfer electrode 122 is electrically separated from the underlying layer 116 by a gate insulation film 123 of silicon oxide. N type well subregion 114 serves as a vertical overflow drain.

The distribution of potential well corresponding to the cell structure of FIG. 11A is shown in FIG. 11B, which assumes that charge packets are like liquid (hatched) in accordance with the convention in the field of solid-state physics. Since photoelectric conversion layer 120 is electrically connected by the coupling layer 118 to channel layer 116, the charge carriers photoelectrically produced within layer 120 in response to an incident light are not permitted to remain continuously within layer 120. These carriers jump a slightly "lower" potential "wall" formed beneath coupling layer 118, and flow into the potential well of channel layer 116 as shown by an arrow 124 to be stored therein.

With such an arrangement, since no signal charge carriers are stored in the N type photoelectric conversion layer 120, it becomes possible to extremely decrease the reverse bias voltage therefor. A leak current, which conventionally tends to occur within the cell structure, can thus be suppressed successfully. Any excess charge carriers, which will take place due to the excess intensity of an incident light, are forced to drain through overflow drain section 114 into substrate 110. In this embodiment, N type channel layer 116 also forms a PN-junction photodiode together with P type well region 112; therefore, it is possible to also use, as the effective signal charge packet, certain charge carriers that are photoelectrically produced by a photoelectric conversion action in directly responding to an extra light component introduced through transfer electrode 122 into channel layer 116. This can make an optical shield electrode unnecessary, which has been generally employed.

Figure 12:
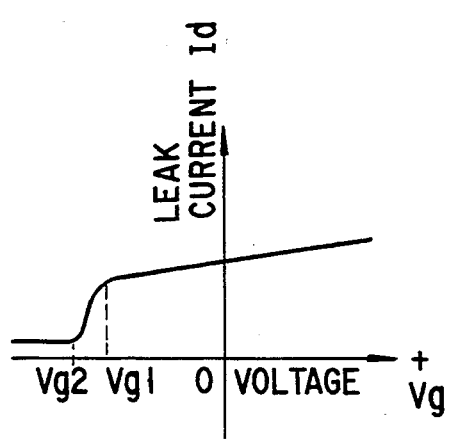
FIG. 12 is a graph showing the voltage-to-current characteristic of the cell structure of FIG. 11A.
Figure 13:
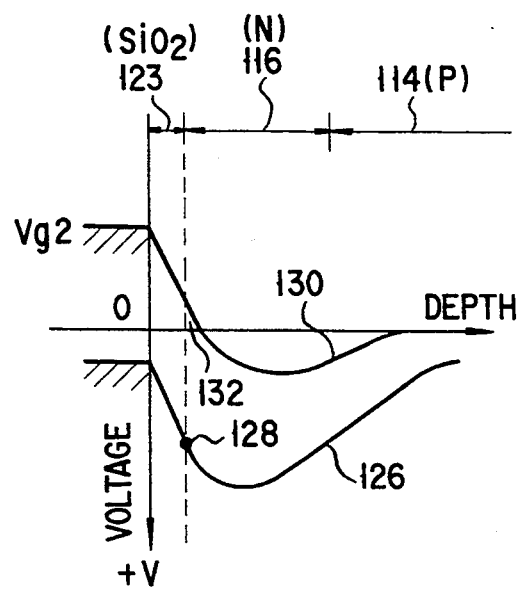
FIG. 13 is a graph showing a potential distribution characteristic along the direction of depth of the FIG. 11A cell structure.

It should be noted that, in the cell structure of FIG. 11A, a leak current flowing in the N type channel layer 116 will behave as a noise to be eliminated therefrom. The voltage-to-current characteristic of the cell structure of FIG. 11A is shown in FIG. 12, wherein the horizontal axis represents a gate voltage Vg to be applied to the transfer electrode 122 of FIG. 11A, and the vertical axis represents the leak current Id called the "dark current." It is apparent from this graph that the dark current Id decreases suddenly when gate current Vg drops down to a potential $-Vg1$. When voltage Vg is less than $-Vg2$, current Id maintains the minimum potential constantly. The potential distribution inside the cell structure along the direction of depth of channel layer 116 of FIG. 11A is shown in FIG. 13. In FIG. 13, a curve 126 is a characteristic line showing the distribution of potential obtained when the transfer electrode 122 is applied with a gate voltage of normal potential that has been conventionally employed. This indicates that a leak current component generated in a $Si/SiO_2$ interface section 128 between N type layer 116 and the overlying silicon oxide layer 123 is a predominant element which determines the whole shape of characteristic curve 126. In contrast, when the transfer electrode 122 is set at potential $-Vg2$ in accordance with the technical teaching from the graph of FIG. 12, the resultant characteristic curve shifts to a line 130. In this case, the $Si/SiO_2$ interface potential is substantially zero with a minute region 132 being left, in which holes will be permitted to stay as integrated carriers. Under such a condition, the generation of dark current Id is remarkably suppressed in the interface section. With the gate voltage selection, it becomes possible to maximize the photosensitivity and to minimize the dark current Id flowing in both the N type photoconversion layer 120 and N type channel layer 116.

Figure 14:
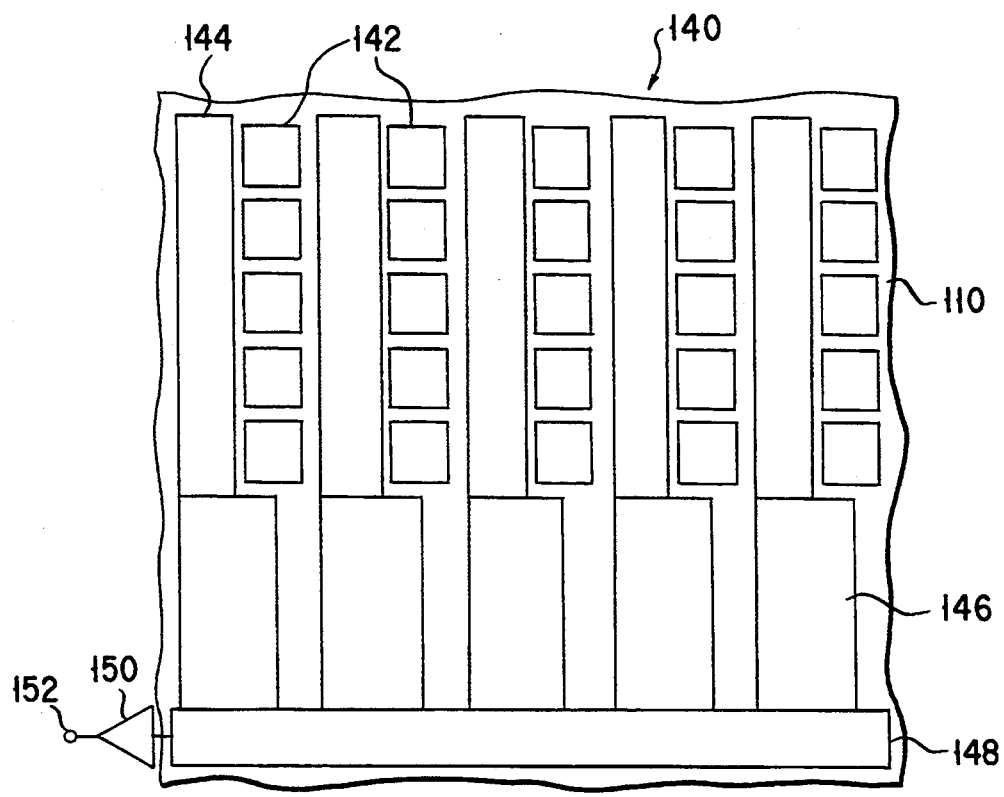
FIG. 14 is a diagram showing the plan view of a solid-state area imager employing the FIG. 11A cell structure for each of its cells.

A CCD imager employing the cell structure of in FIG. 11A is generally designated by the numeral 140 in FIG. 14. The characteristic feature of the imager 140 is that it compensates for the limit of the efficiency of signal-charge transfer during the carrier storage (integration) period.

As shown in FIG. 14, an array of rows and columns of photodiode cells 142 is arranged on substrate 110 in a matrix fashion. Each cell 142 is similar in structure to that shown in FIG. 11A. A plurality of vertical CCD transfer sections 144 are coupled to the columns of cells. Each vertical transfer section 144 transfers charge carriers that are read from a corresponding cell column in the vertical direction toward its output. The outputs of vertical transfer sections 144 are connected through buffer sections 146 to a horizontal CCD transfer section 148. Each buffer section 146 temporarily stores therein signal charge carriers fed thereto for a predetermined period of time, and then transfer them toward the horizontal transfer section 148. Obviously, each buffer 146 has a storage capacity large enough to be capable of storing the total amount of carriers read from certain cells 142 associated with one of the vertical transfer section 144 coupled to the buffer 146. Horizontal transfer section 148 has an output, which is connected to an amplifier circuit 150 called the "output amplifier." Output amplifier 150 is connected to an output terminal 152.

With the imager 140 of FIG. 14, the storage or integration of signal charge carriers during an image sensing operation is effected in the vertical transfer sections 144, rather than in the photodiode cells 142. The operation of imager 140 will be described below with reference to FIG. 15, which shows the pulsing sequence of three major electrical signals: a composite blanking pulse signal Sc under a normal transmission performance in television system, a vertical transfer pulse signal Sv for the vertical transfer sections 144 of FIG. 14, and a drive pulse signal Sb for the buffer sections 146.

AS shown in FIG. 15, the composite signal Sc has a vertical blanking pulse 154 during a period T1, and horizontal retrace pulses 156 during a frame period T2. These pulses are so narrow in width that each of these looks like a thin line for the illustration purposes only. Vertical transfer signal Sv has a high-speed pulse 158 at the end of each vertical blanking period T1. Signal Sv maintains a low-level DC potential within periods T2. When high-speed transfer pulse 158 is supplied to vertical transfer sections 144, the signal charge carriers are sequentially transferred thereinto. Buffer drive signal Sb has a high-speed transfer pulse 160 during each period T1, and has a plurality of line-shift pulses within each period T2. In responding to high-speed transfer pulse 160, the carriers are transferred from each vertical transfer section 144 to a corresponding buffer section 146. These carriers are then moved line-by-line to horizontal transfer section 148 in response to line-shift pulses 162 during period T2. With such a signal carrier transfer scheme, the imager 140 of FIG. 14 may be called the "frame-transfer" type imager.

A cell structure shown in FIG. 16 is similar to that of FIG. 11A with the P type well region 112a being partially decreased in depth at a position beneath the N type photoconversion layer 120, also. More specifically, P type well region 112a has a shallow subregion 166 in addition to the shallow subregion 114. Subregion 166 serves as a vertical CCD overflow drain. In the frame-transfer CCD imager 140, since the photosensitivity remains effective even during the high-speed pulse generating period, a "smear" phenomenon will occur (practically, bar-shaped noises are generated in the upper and power areas of a sensed image of a bright object). Such smear can be eliminated successfully, by forcing the carriers that are produced within N type diffusion layer 120 during the signal-charge high-speed transfer period to drain into substrate 110 by way of the additional vertical overflow drain section 166 of FIG. 16. In this case, as shown in FIG. 17, substrate 110 is applied with a substate-potential control signal Ssub. This signal has a pulse 168 at the end of each vertical blanking period T1. Pulse 168 is similar in pulse width to high-speed pulses 158, 160 of signals Sc, Sb. Pulse 168 serves as a sensitivity-limit pulse during the signal-charge high-speed transfer period.

A CCD cell structure shown in FIG. 18 is similar to that of FIG. 11A with layers 170, 172, 174, 176 being added. The layer 170 is a dielectric layer that is arranged on the top surface of substrate 110. Layer 170 may be made from silicon oxide material. The layer 172 has an opening 177, which causes the underlying N type diffusion layer 120 to be exposed partly on its surface. Layer 172 is a metal layer with a "T"-shaped profile. This T-shaped layer 172 is formed on dielectric layer 170. T-shaped layer 172 consists of a layer portion that is buried in opening 177 to form the base of the "T," and a layer portion that is positioned on the top surface of dielectric layer 170 to define the cross-bar of the "T" as shown. The layer 174 is an additional photoconversion layer. This layer may be made from amorphous silicon or amorphous selenium. The layer 176 is a transparent conductive thin film, which is laid on the top surface of photoconversion layer 174. This thin film may be made from indium-tin-oxide (ITO); it serves as a transparent electrode. Terminal 178 is connected to electrode 176.

With the cell structure shown in FIG. 18, while a positive voltage +V is applied to the ITO electrode 174 via terminal 178, N type photoconversion layer 120 is reverse biased, thereby preventing carriers from flowing out of layer 120 into N type buried channel layer 116 during the signal-charge high-speed transfer period. The occurrence of a smear can thus be eliminated. The main drive signals to be employed in this case are similar to those shown in FIG. 17, with the substrate-potential control signal Ssub of FIG. 17 being used as a drive signal fed to ITO electrode 176 through terminal 178. With such an arrangement, N type photoconversion layer 120 is electrically coupled to N type channel layer 116 during the signal-charge accumulation period; and, during the high-speed transfer period, layer 120 is electrically separated from N type channel layer 116. By setting the bias voltage for N type layer 120 at substantially zero volts in the same manner as in the previous embodiments, the generation of leak current can be minimized to minimize dark-current noise, thus maximizing the photosensitivity of the imager.

Figure 19:
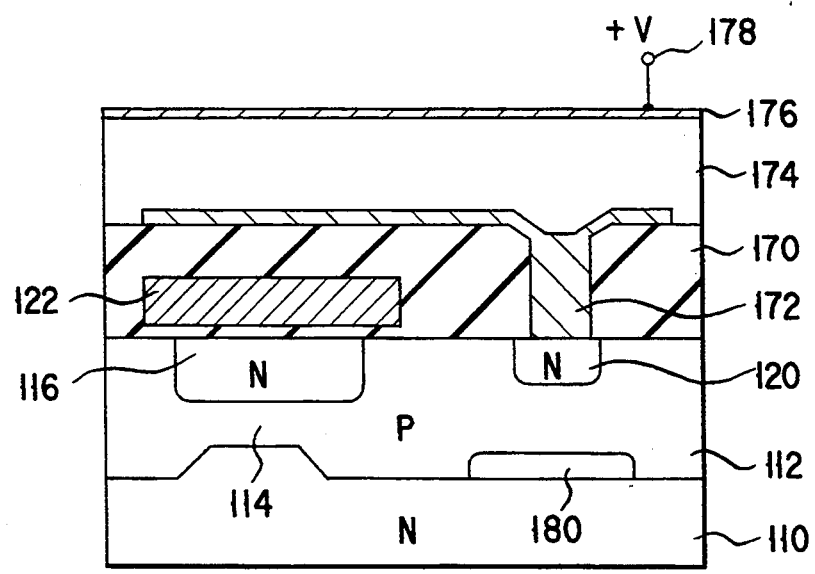

A cell structure shown in FIG. 19 is similar to that of FIG. 18 with the intermediate N type layer 118 being deleted and with a carrier-diffusion prevention layer 180 being added at the bottom of P type well region 112. The layer 180 may be made from silicon, which serves as a current-flow stopper layer. By causing the bias voltage for N type photoconversion layer 120 to be zero or slightly forward-biased, the charge carriers integrated in layer 120 are drained to P type well region 112, and finally arrive at N type channel layer 116. This means that these layers 116, 120 still remain electrically coupled together or "communicatable" with each other without N type intermediate layer 118. Furthermore, adding the layer 180 can suppress or prevent a part of carriers released to P type well region 112 from flowing into substrate 110 undesirably.

The present invention is not limited to the above-described specific embodiments and may be practiced or embodied in still other ways without departing from the spirit or essential character thereof.

What is claimed is:

1. A solid-state image sensing device comprising:
   a semiconductive substrate;
   an array of photosensitive cells arranged on said substrate;
   transfer means electrically coupled with said array on said substrate, for transferring electrical carriers read from said cells along a predetermined direction; and
   carrier controller means for suppressing or preventing carriers photoelectrically generated in said cells from continuously staying within said cells by forcing the carriers to moving into said transfer means, and for causing the carriers to be stored in said transfer means;
   each of said cells comprising,
      a semiconductive well region in said substrate, said well region being different in conductivity type from a conductivity type of said substrate,
      a first semiconductive layer, arranged within said well region, having a same conductivity type as the conductivity type of said substrate and being arranged in said well region, said well region and the first layer forming a photodiode,
      a second semiconductive layer, arranged within said well region, having a same conductivity type as the conductivity type of said first layer and being spaced apart from said first layer in said well region, and a third semiconductive layer, arranged within said well region, having a same conductivity type as the conductivity type of said first and said second layers, and coupled with said first and said second layers.

2. A device according to claim 1, wherein each of said cells comprises:
a gate electrode overlying the second layer; and
carrier-movement accelerator means for expediting carriers to flow from said first layer to said second layer.

3. A device according to claim 2, further comprising:
overflow drain means arranged in said well region, for causing new carriers, which are photoelectrically produced in said first layer during carrier movement between said first layer and said second layer, to flow into said substrate at least partially.

4. A device according to claim 3, further comprising:
an additional photoconversion layer overlying said substrate with said gate electrode being sandwiched between said substrate and said photoconversion layer;
a transparent electrode on said photoconversion layer; and
voltage supply means electrically coupled to said transparent electrode, for allowing said photoconversion layer to be set at a certain potential independently of said first layer, while causing said first layer to be reverse biased.

5. A device according to claim 4, further comprising:
means arranged at a bottom of said well region beneath said first layer, for suppressing a part of carriers which have flown out of said first layer toward said second layer from flowing into said substrate.

6. A solid state imaging device according to claim 1, wherein:
said third semiconductive layer is coupled with only side portions of said first and said second layers.

7. A solid state imaging device according to claim 1, wherein:
said semiconductive well region comprises a sub-region under said second semiconductive layer which is narrower than a region of said semiconductive well region under said first semiconductive layer.

8. A solid state imaging device according to claim 6, wherein:
said semiconductive well region comprises a sub-region under said second semiconductive layer which is narrower than a region of said semiconductive well region under said first semiconductive layer.

9. A solid state imaging device according to claim 1, wherein:
a voltage applied to said transfer means which causes said transferring of electrical carriers is less than or equal to a voltage at which a leak current remains constant, in order to prevent a leak current from increasing between a gate insulator film which is disposed on top of said first, second and third semiconductive layers and said second semiconductive layer.

10. A solid state imaging device according to claim 6, wherein:
a voltage applied to said transfer means which causes said transferring of electrical carriers is less than or equal to a voltage at which a leak current remains constant, in order to prevent a leak current from increasing between a gate insulator film which is disposed on top of said first, second and third semiconductive layers and said second semiconductive layer.

11. A solid-state image sensing device comprising:
a semiconductive substrate;
an array of photosensitive cells arranged on said substrate;
transfer means electrically coupled with said array on said substrate, for transferring electrical carriers read from said cells along a predetermined direction; and
carrier controller means for suppressing or preventing carriers photoelectrically generated in said cells from continuously staying within said cells by forcing the carriers to moving into said transfer means, and for causing the carriers to be stored in said transfer means;
each of said cells comprising,
a semiconductive well region in said substrate, said well region being different in conductivity type from a conductivity type of said substrate,
a first semiconductive layer, arranged within said well region, having a same conductivity type as the conductivity type of said substrate and being arranged in said well region, said well region and the first layer forming a photodiode,
a second semiconductive layer, arranged within said well region, having a same conductivity type as the conductivity type of said first layer and being spaced apart from said first layer in said well region,
a carrier-diffusion prevention layer arranged under said first semiconductive layer at a bottom of said well region, and
a transfer electrode arranged over said second semiconductive layer, wherein
said semiconductive well region has a shallow well subregion formed under said second semiconductive layer.

12. A device according to claim 11, further comprising
a T-shaped layer connected to said first semiconductive layer and arranged over said transfer electrode,
a photoconversion layer arranged over said T-shaped layer, and
an electrode, which is made of a transparent conductive thin film, arranged over a top surface of said photoconversion layer.

* * * * *